(12) United States Patent
Liu et al.

(10) Patent No.: US 11,482,666 B2
(45) Date of Patent: Oct. 25, 2022

(54) METHOD FOR FABRICATING A SEMICONDUCTOR DEVICE

(71) Applicant: UNITED MICROELECTRONICS CORP., Hsin-Chu (TW)

(72) Inventors: Hsin-Jung Liu, Pingtung County (TW); Chau-Chung Hou, Tainan (TW); Ang Chan, Taipei (TW); Kun-Ju Li, Tainan (TW); Wen-Chin Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 238 days.

(21) Appl. No.: 17/023,382

(22) Filed: Sep. 17, 2020

(65) Prior Publication Data

US 2022/0085284 A1    Mar. 17, 2022

(51) Int. Cl.

| | | |
|---|---|---|
| *H01L 43/12* | (2006.01) | |
| *H01L 27/22* | (2006.01) | |
| *H01L 43/08* | (2006.01) | |
| *H01L 43/02* | (2006.01) | |
| *H01L 43/10* | (2006.01) | |

(52) U.S. Cl.
CPC ............. *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ....... H01L 43/12; H01L 27/222; H01L 43/02; H01L 43/08; H01L 43/10
USPC ............................................................ 438/3
See application file for complete search history.

(56) References Cited

U.S. PATENT DOCUMENTS

| | | | | |
|---|---|---|---|---|
| 6,150,260 A | * | 11/2000 | Roy .................. | H01L 21/76819 438/959 |
| 6,221,775 B1 | * | 4/2001 | Ference .............. | H01L 21/3212 438/692 |
| 6,274,485 B1 | * | 8/2001 | Chen ................... | H01L 21/7684 438/653 |
| 6,528,386 B1 | | 3/2003 | Summerfelt | |
| 7,229,927 B1 | * | 6/2007 | Darcangelo ......... | H01L 21/7684 438/693 |
| 7,265,447 B2 | | 9/2007 | Yu | |
| 2018/0158728 A1 | * | 6/2018 | Chu .................... | H01L 45/1675 |

* cited by examiner

*Primary Examiner* — Jami Valentine Miller
(74) *Attorney, Agent, or Firm* — Winston Hsu (57) ABSTRACT

A semiconductor substrate is provided. The semiconductor substrate has thereon a first dielectric layer, at least one conductive pattern disposed in the first dielectric layer, and a second dielectric layer covering the first dielectric layer and the at least one conductive pattern. A via opening is formed in the second dielectric layer. The via opening exposes a portion of the at least one conductive pattern. A polish stop layer is conformally deposited on the second dielectric layer and within the via opening. A barrier layer is conformally deposited on the polish stop layer. A tungsten layer is conformally deposited on the barrier layer. The tungsten layer and the barrier layer are polished until the polish stop layer on the second dielectric layer is exposed, thereby forming a via plug in the via opening. A bottom electrode layer is conformally deposited on the second dielectric layer and the via plug.

20 Claims, 9 Drawing Sheets

METHOD FOR FABRICATING A SEMICONDUCTOR DEVICE

BACKGROUND OF THE INVENTION

1. Field of the Invention

The present invention relates to the field of semiconductor technology, and in particular to an improved method of manufacturing a magneto-resistive random access memory (MRAM) device.

2. Description of the Prior Art

MRAM is a non-volatile random access memory technology that could replace the dynamic random access memory (DRAM) as the standard memory for computing devices. In MRAM devices, the spin of electrons is used to indicate the presence of a "1" or "0." MRAM devices comprise conductive lines (wordlines and bitlines) positioned in a different direction, e.g., perpendicular to one another in different metal layers, the conductive lines sandwiching a resistive memory element comprising a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

The MTJ of the MRAM device typically comprises a first magnetic layer, a tunnel insulator formed over the first magnetic layer, and a second magnetic layer formed over the tunnel insulator. The first magnetic layer and the second magnetic layer each typically comprise one or more layers of magnetic materials and/or metal materials, for example. The first magnetic layer may comprise a seed layer of Ta and/or TaN, an antiferromagnetic layer such as PtMn disposed over the seed layer, and one or more magnetic material layers comprising CoFe, NiFe, CoFeB, Ru, other materials, or combinations thereof disposed over the antiferromagnetic layer, as examples. The first magnetic layer is also referred to as a fixed layer because its magnetic polarity is fixed. The second magnetic layer may comprise one or more magnetic material layers comprising CoFe, NiFe, CoFeB, other magnetic material layers, or combinations thereof, as examples. The second magnetic layer is also referred to as a free layer because its magnetic polarity changes when the magnetic memory cell is written to. The tunnel insulator may comprise a thin insulator such as $Al_2O_3$ or semiconductive materials, as examples.

One of the challenges in forming MRAM devices during Back End of Line (BEOL) processing lies in the lithographic alignment of MTJs to the metal level beneath. Current approach to alignment for MTJ stacks is to introduce topography into the alignment mark area of the underlying metal level that can be seen through the MTJ. However, the chemical mechanical polishing (CMP) prior to MTJ stack deposition that is associated with this technique can lead to dishing, this making the alignment more difficult.

SUMMARY OF THE INVENTION

One object of the present invention is to provide an improved method of manufacturing a semiconductor device to solve the above-mentioned shortcomings and shortcomings of the prior art.

One aspect of the invention provides a method for fabricating a semiconductor device.

A semiconductor substrate is provided. The semiconductor substrate has thereon a first dielectric layer, at least one conductive pattern disposed in the first dielectric layer, and a second dielectric layer covering the first dielectric layer and the at least one conductive pattern. A via opening is formed in the second dielectric layer. The via opening exposes a portion of the at least one conductive pattern. A polish stop layer is conformally deposited on the second dielectric layer and within the via opening. A barrier layer is conformally deposited on the polish stop layer. A tungsten layer is conformally deposited on the barrier layer. The tungsten layer and the barrier layer are polished until the polish stop layer on the second dielectric layer is exposed, thereby forming a via plug in the via opening. A bottom electrode layer is conformally deposited on the second dielectric layer and the via plug.

According to some embodiments, the polish stop layer is a tantalum nitride layer and the barrier layer is a titanium nitride layer.

According to some embodiments, the bottom electrode layer is a tantalum nitride layer.

According to some embodiments, a thickness of the polish stop layer is smaller than a thickness of the bottom electrode layer.

According to some embodiments, the thickness of the polish stop layer ranges between 20 and 60 angstroms and the thickness of the bottom electrode layer ranges between 100 and 200 angstroms.

According to some embodiments, after depositing the bottom electrode layer on the second dielectric layer and the via plug, the method further comprises: polishing the bottom electrode layer.

According to some embodiments, after the bottom electrode layer is conformally deposited on the second dielectric layer and the via plug, a magnetic tunnel junction (MTJ) stack layer is formed on the bottom electrode layer. A top electrode layer is then deposited on the MTJ stack layer. The top electrode layer, the MTJ stack layer and the bottom electrode layer are patterned, thereby forming magnetic memory element on the via plug.

According to some embodiments, the top electrode layer comprises a tantalum layer.

According to some embodiments, the MTJ stack layer comprises a reference layer, a tunnel barrier layer, and a free layer.

According to some embodiments, a nitrogen-doped carbide (NDC) layer is formed between the first dielectric layer and the second dielectric layer.

Another aspect of the invention provides a method for fabricating a semiconductor device. A semiconductor substrate is provided. The semiconductor substrate has thereon a first dielectric layer, at least one conductive pattern disposed in the first dielectric layer, and a second dielectric layer covering the first dielectric layer and the at least one conductive pattern. A via opening and an alignment mark trench are formed in the second dielectric layer. The via opening exposes a portion of the at least one conductive pattern. A polish stop layer is conformally deposited on the second dielectric layer and within the via opening and the alignment mark trench. A barrier layer is conformally deposited on the polish stop layer. A tungsten layer is conformally deposited on the barrier layer. The tungsten layer and the barrier layer are polished until the polish stop layer on the second dielectric layer is exposed, thereby forming a via plug in the via opening. A remaining portion of the tungsten layer within the alignment mark trench constitutes a recessed feature. A bottom electrode layer is conformally deposited on the second dielectric layer, the via plug and the recessed feature.

According to some embodiments, the polish stop layer is a tantalum nitride layer and the barrier layer is a titanium nitride layer.

According to some embodiments, the bottom electrode layer is a tantalum nitride layer.

According to some embodiments, a thickness of the polish stop layer is smaller than a thickness of the bottom electrode layer.

According to some embodiments, the thickness of the polish stop layer ranges between 20 and 60 angstroms and the thickness of the bottom electrode layer ranges between 100 and 200 angstroms.

According to some embodiments, after depositing the bottom electrode layer on the second dielectric layer, the via plug and the recessed feature, the method further comprises: polishing the bottom electrode layer.

According to some embodiments, after the bottom electrode layer is deposited, a magnetic tunnel junction (MTJ) stack layer is formed on the bottom electrode layer. A top electrode layer is then deposited on the MTJ stack layer. The top electrode layer, the MTJ stack layer and the bottom electrode layer are patterned, thereby forming magnetic memory element on the via plug.

According to some embodiments, the top electrode layer comprises a tantalum layer.

According to some embodiments, the MTJ stack layer comprises a reference layer, a tunnel barrier layer, and a free layer.

According to some embodiments, a nitrogen-doped carbide (NDC) layer is formed between the first dielectric layer and the second dielectric layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
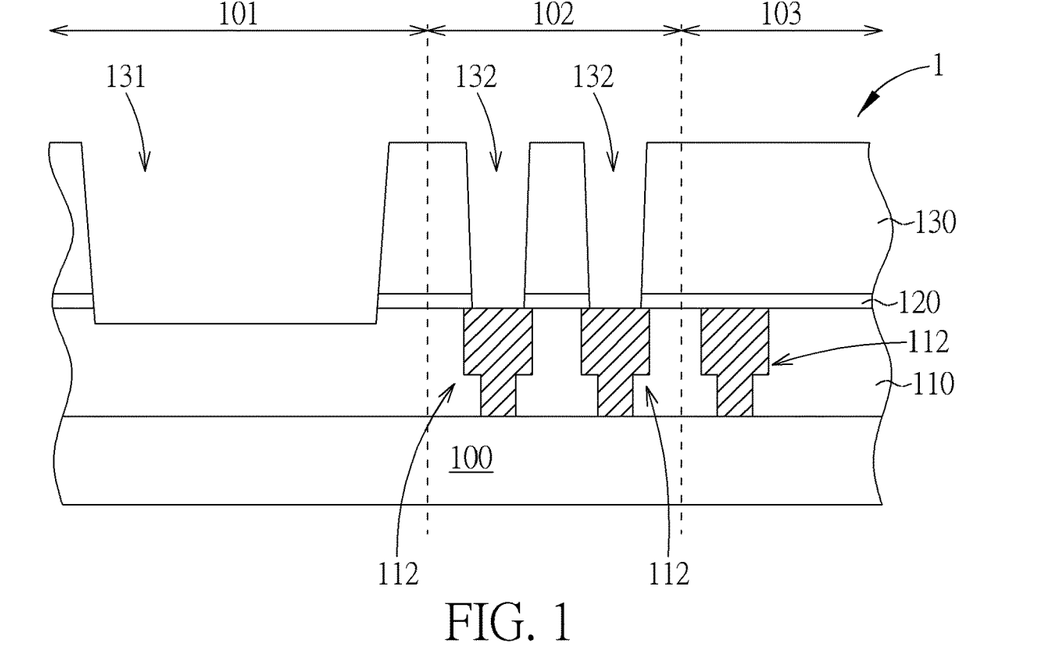
FIG. 1 to FIG. 7 are schematic diagrams showing an exemplary method for forming an integrated circuit device according to an embodiment of the present invention.

Please refer to FIG. 1 to FIG. 7. FIG. 1 to FIG. 7 are schematic diagrams showing an exemplary method for forming an integrated circuit device 1, for example, a magnetic tunnel junction (MTJ) device, according to an embodiment of the present invention. As shown in FIG. 1, a substrate 100 such as a semiconductor substrate is provided. An alignment mark region 101, a MTJ forming region 102, and a non-MTJ region 103 are defined on the substrate 100. A first dielectric layer 110, such as an ultra-low dielectric constant (ultra-low k or ULK) layer, is deposited on the substrate 100. At least one conductive pattern 112, for example, copper damascene or dual damascene structures, may be disposed in the first dielectric layer 110 within the MTJ forming region 102. For illustration purposes, three exemplary conductive patterns 112 are shown in the figures. Two of the three exemplary conductive patterns 112 are disposed within the MTJ forming region 102.

According to one embodiment, a nitrogen-doped carbide (NDC) layer 120 may be deposited on the first dielectric layer 110. According to one embodiment, the NDC layer 120 may have a thickness of about 200~400 angstroms, but is not limited thereto. A second dielectric layer 130 such as a tetraethylorthosilicate (TEOS) oxide layer is then deposited over the NDC layer 120, the first dielectric layer 110 and the at least one conductive pattern 112. According to one embodiment, the second dielectric layer 130 may have a thickness of about 1000~2000 angstroms, but is not limited thereto.

Subsequently, an alignment mark trench 131 and at least one via opening 132 are formed in the second dielectric layer 130 and the NDC layer 120 within the alignment mark region 101 and the MTJ forming region 102, respectively. For illustration purposes, two exemplary via openings 132 are shown in the figures. Each of the two exemplary via openings 132 exposes a portion of each of the two exemplary conductive patterns 112 within the MTJ forming region 102. The process of forming the alignment mark trench 131 and the via openings 132 in the second dielectric layer 130 and the NDC layer 120 may involve lithographic processes and etching processes known in the art.

Figure 2:
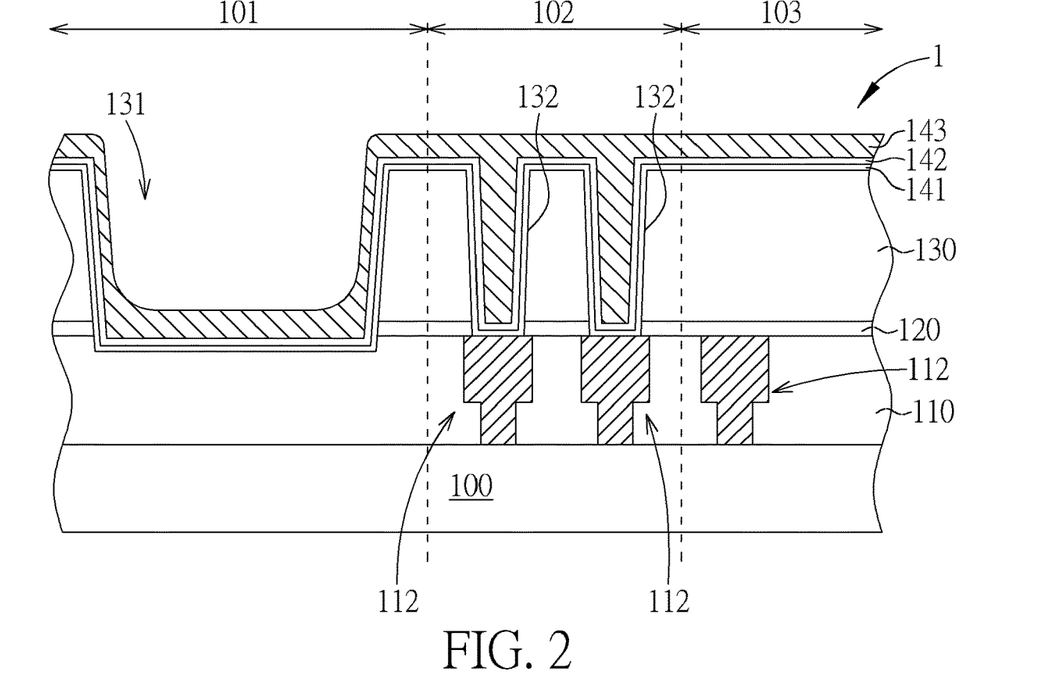

As shown in FIG. 2, a polish stop layer 141 is then conformally deposited on the second dielectric layer 130 and within the via openings 132 and the alignment mark trench 131. According to one embodiment, for example, the polish stop layer 141 may be a tantalum nitride (TaN) layer. According to one embodiment, the polish stop layer 141 may have a thickness of about 20-60 angstroms, but is not limited thereto. The polish stop layer 141 conformally covers the interior surfaces of the via openings 132 and the alignment mark trench 131.

Subsequently, a barrier layer 142 is conformally deposited on the polish stop layer 141. According to one embodiment, for example, the barrier layer may be a titanium nitride (TiN) layer. After the formation of the barrier layer 142, a tungsten layer 143 is then conformally deposited on the barrier layer 142. At this point, the via openings 132 may be completely filled with the polish stop layer 141, the barrier layer 142, and the tungsten layer 143.

Figure 3:
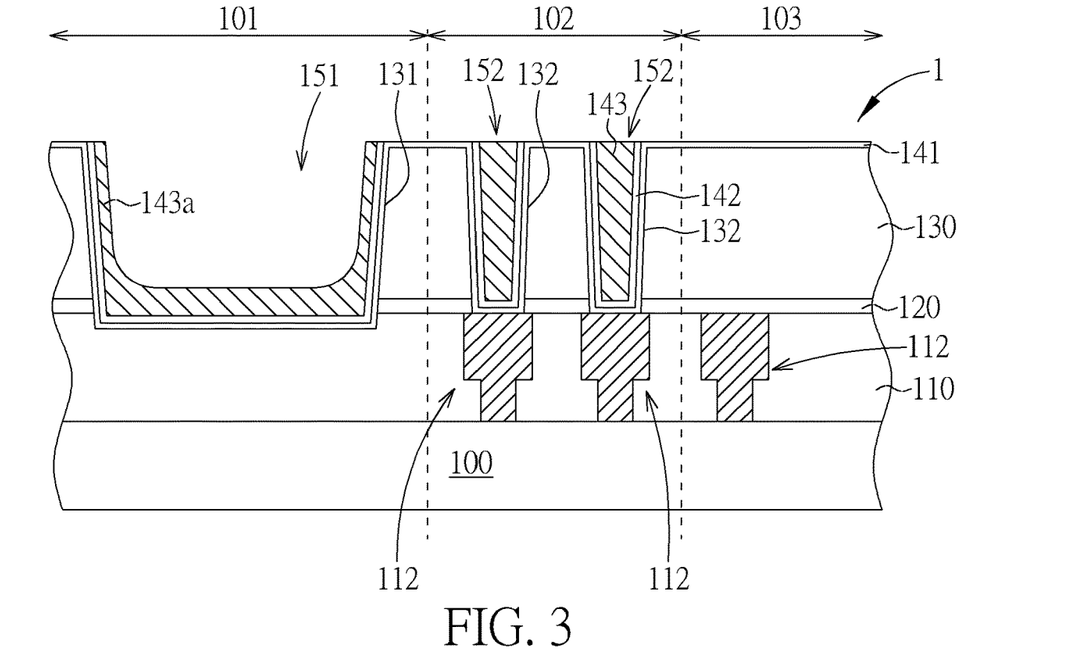

As shown in FIG. 3, subsequently, a chemical mechanical polishing (CMP) process is performed to polish the tungsten layer 143 and the barrier layer 142 until the polish stop layer 141 on the second dielectric layer is exposed, thereby forming a via plug 152 in each via opening 132. A remaining portion 143a of the tungsten layer 143 within the alignment mark trench 101 constitutes a recessed feature 151. According to one embodiment, the CMP process has high selectivity for polishing the tungsten layer 143 and the barrier layer 142 relative to the polish stop layer 141. For example, the CMP process may have a W:TiN:TaN selectivity ratio of 1:1:0.1. At this point, the top surface of the second dielectric layer 130 is still covered by the polish stop layer 141.

Figure 4:
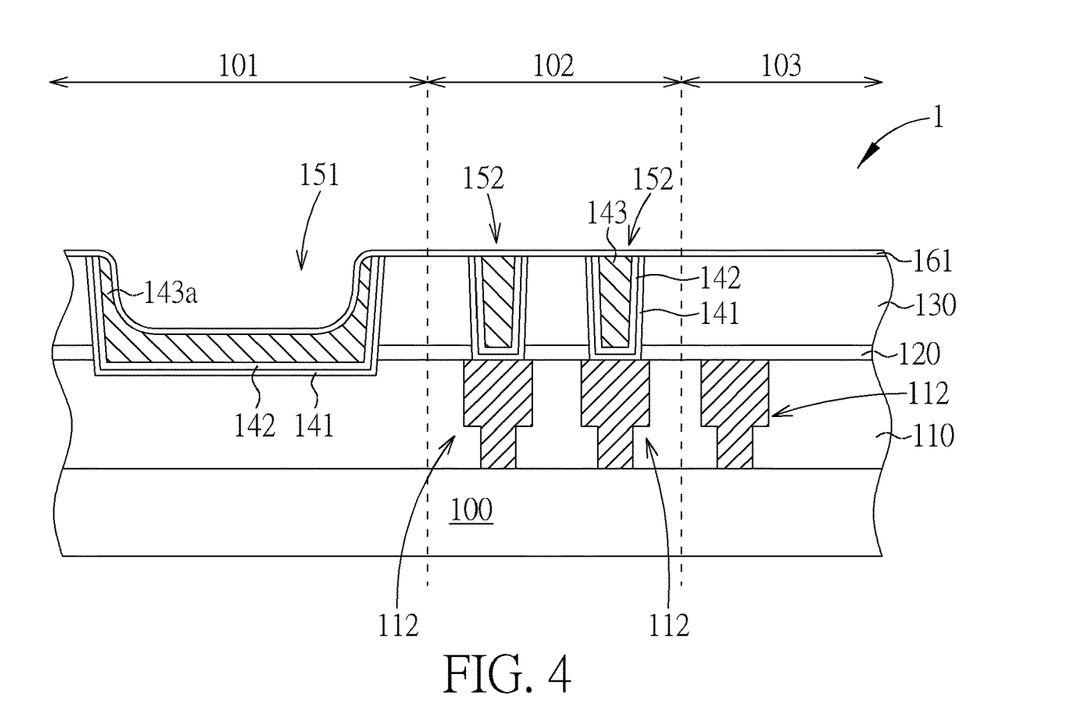

As shown in FIG. 4, another CMP process may be performed to polish the polish stop layer 141, the second dielectric layer 130, the via plug 152, and the tungsten layer 143 within the alignment mark trench 101. After the CMP process, the remaining thickness of the second dielectric layer 130 may be about 1200 angstroms, for example. According to one embodiment, a bottom electrode layer 161 is then conformally deposited on the second dielectric layer 130, the via plugs 152 and the recessed feature 151.

According to one embodiment, for example, the bottom electrode layer 161 may be a tantalum nitride (TaN) layer. According to one embodiment, for example, the bottom electrode layer 161 may have a thickness ranging between 100 and 200 angstroms, for example, about 170 angstroms. In order to meet the roughness specification of the bottom electrode layer 161, after depositing the bottom electrode layer 161 on the second dielectric layer 130, the via plugs 152 and the recessed feature 151, another CMP process may be performed to planarize the bottom electrode layer 161. According to one embodiment, a thickness of the polish stop layer 141 is smaller than a thickness of the bottom electrode layer 161.

Figure 5:
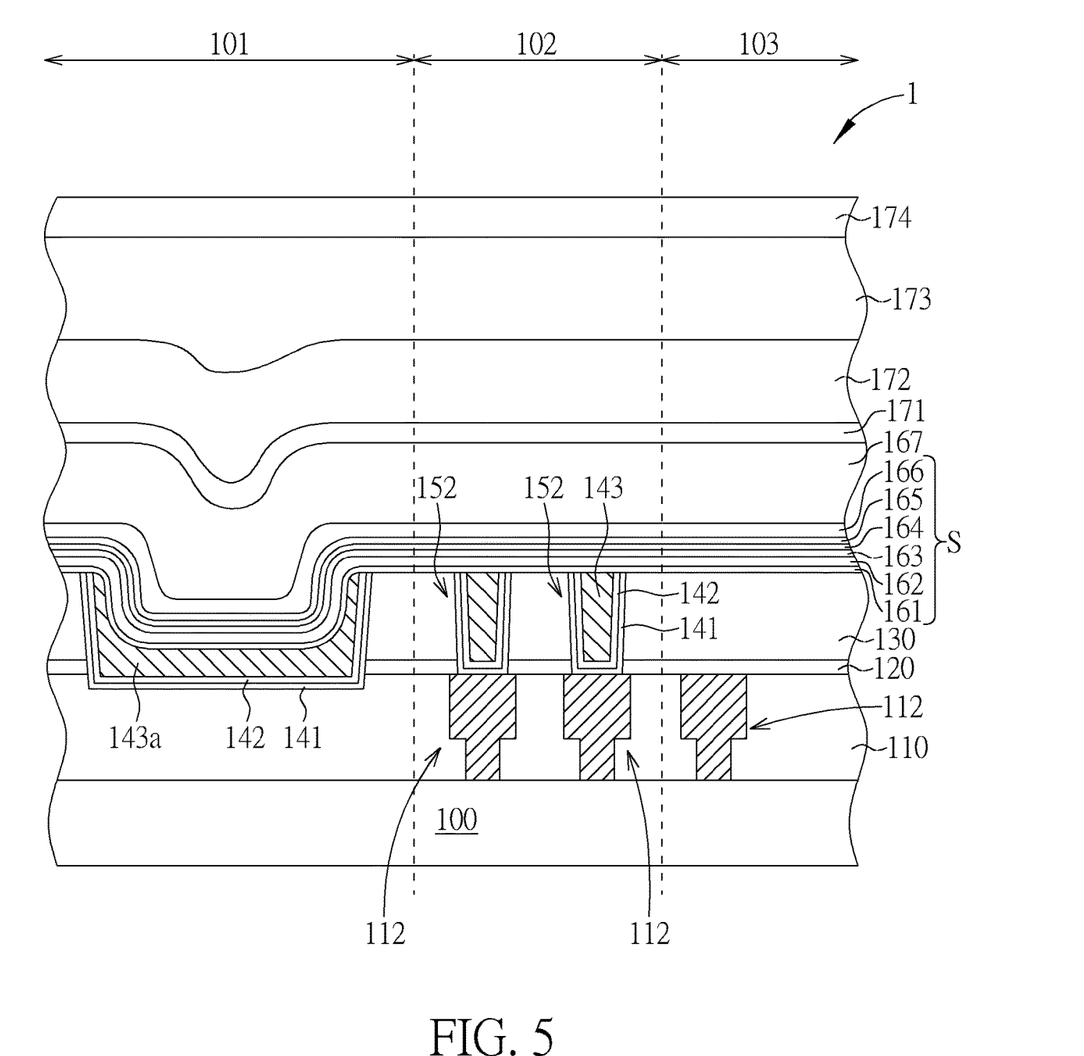

As shown in FIG. 5, after the bottom electrode layer 161 is planarized, a magnetic tunnel junction (MTJ) stack layer S may be deposited on the bottom electrode layer 161. According to one embodiment, for example, the MTJ stack layer S may comprise a seed layer 162 on the bottom electrode layer 161, a magnetic reference (or "pinned") layer 163 on the seed layer 162, a tunnel barrier layer 164 on the magnetic reference layer 163, a magnetic free layer 165 on the tunnel barrier layer 164, and a capping layer 166 on the free layer 165. A top electrode layer 167 is then deposited on the MTJ stack layer S. According to one embodiment, for example, the top electrode layer 167 comprises a tantalum (Ta) layer and may have a thickness of about 600 angstroms, but not limited thereto.

According to one embodiment, a silicon nitride hard mask layer 171 is deposited on the top electrode layer 167 and a silicon oxide hard mask layer 172 is deposited on the silicon nitride hard mask layer 171. According to one embodiment, for example, the silicon nitride hard mask layer 171 may have a thickness of about 300 angstroms and the silicon oxide hard mask layer 172 may have a thickness of about 1400 angstroms, but not limited thereto. According to one embodiment, an organic dielectric layer (ODL) 173 and a bottom anti-reflective layer (BARC) 174 may be deposited on the silicon oxide hard mask layer 172.

Figure 6:
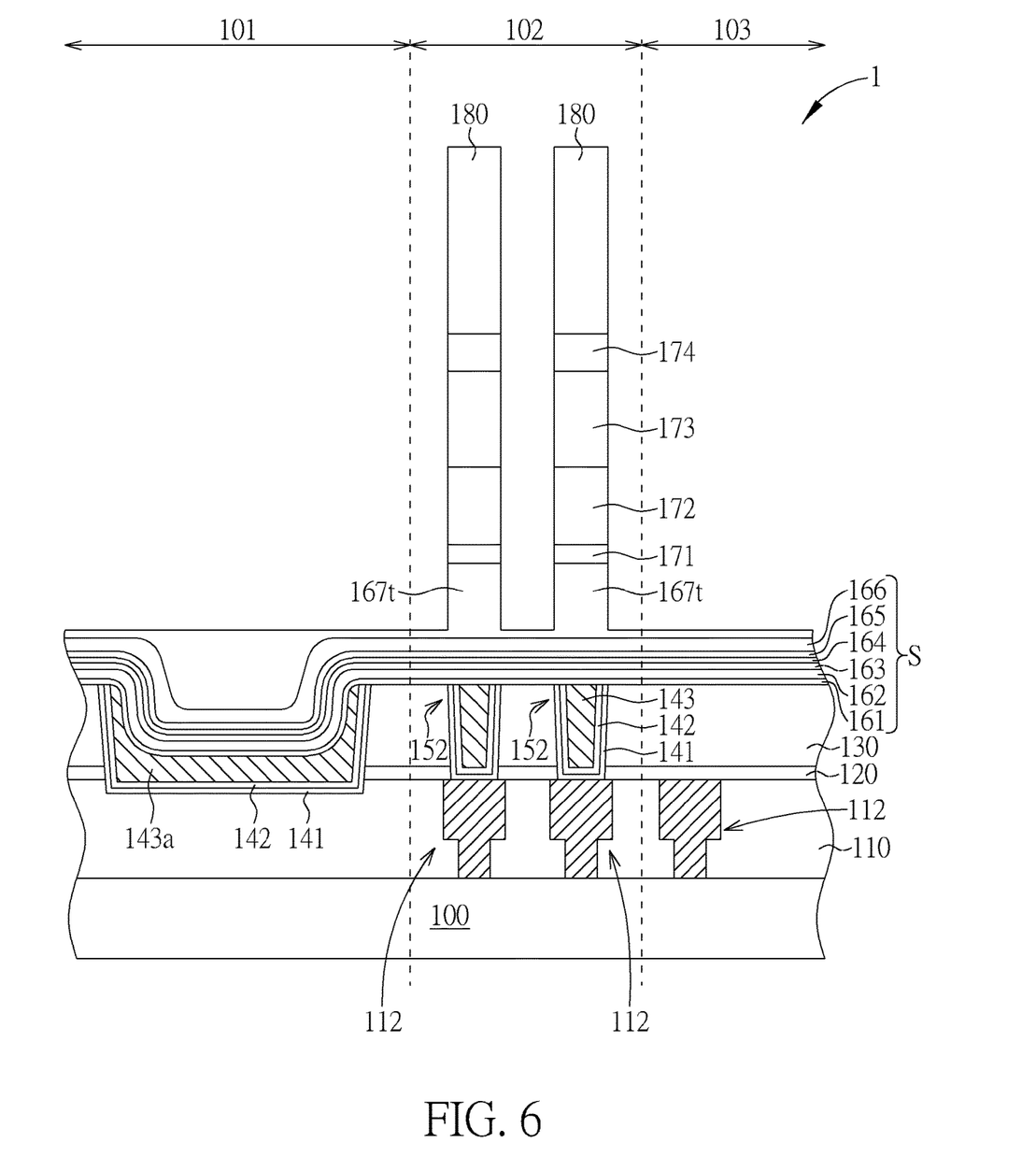

As shown in FIG. 6, a lithographic process and an etching process are carried out to pattern the top electrode layer 167 into top electrodes 167t. For example, a photoresist pattern 180 is formed on the BARC 174. An anisotropic dry etching process may be performed to etch the BARC 174, the ODL 173, the silicon oxide hard mask layer 172, the silicon nitride hard mask layer 171, and the top electrode layer 167 not covered by the photoresist pattern 180. Subsequently, the remaining photoresist pattern 180 may be stripped off.

Figure 7:
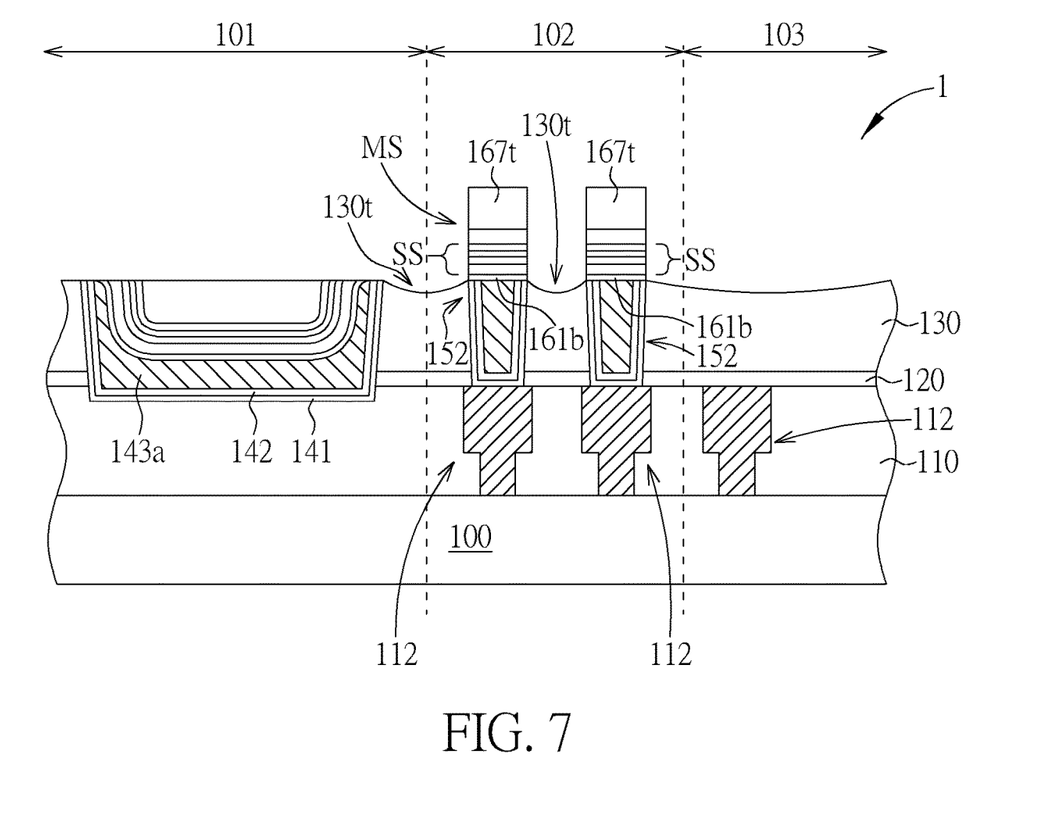

As shown in FIG. 7, an ion beam etching (IBE) process is then performed to pattern the magnetic tunnel junction (MTJ) stack layer S and the bottom electrode layer 161 into MTJ elements SS and bottom electrodes 161b, thereby forming a magnetic memory element MS on each via plug 152. After the IBE process is performed, a concave or curved top surface 130t of the second dielectric layer 130 is formed around the magnetic memory element MS.

Figure 8:
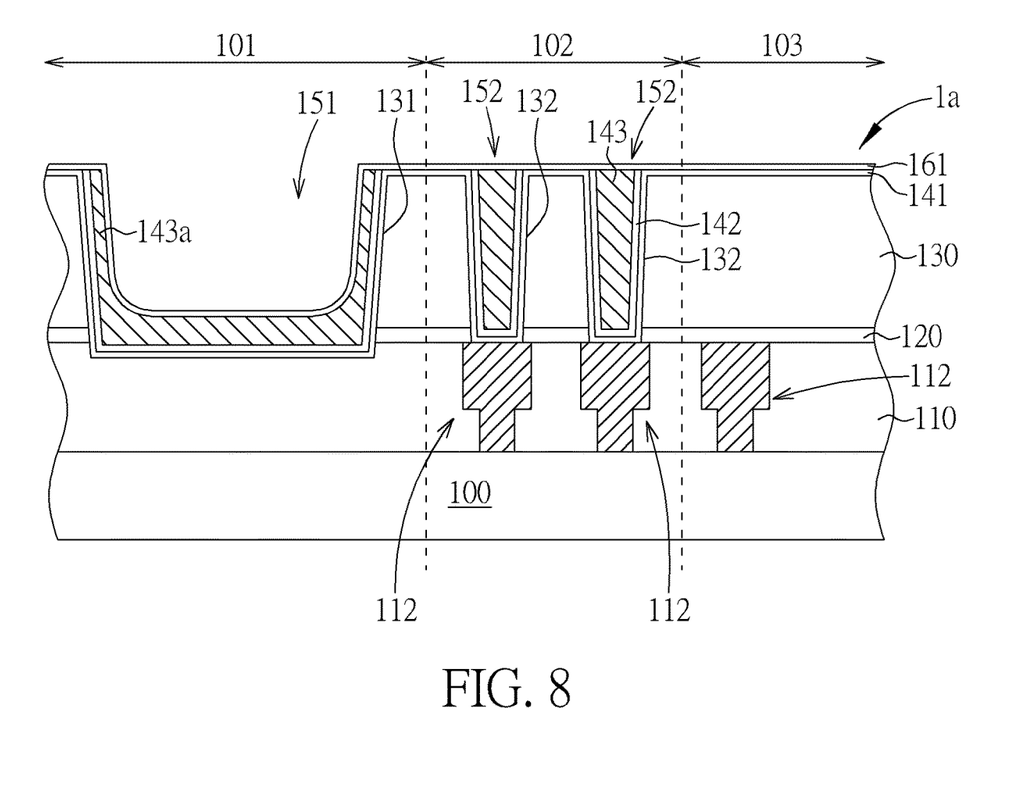
FIG. 8 to FIG. 11 are schematic diagrams showing an exemplary method for forming an integrated circuit device according to another embodiment of the present invention.

FIG. 8 to FIG. 11 are schematic diagrams showing an exemplary method for forming an integrated circuit device 1a, for example, a magnetic tunnel junction (MTJ) device, according to another embodiment of the present invention, wherein like numeral numbers and labels designate like layers, regions or elements. As shown in FIG. 8, according to another embodiment, after the tungsten layer 143 is deposited as depicted in FIG. 2, a bottom electrode layer 161 is then conformally deposited on the second dielectric layer 130, the via plugs 152 and the recessed feature 151. According to one embodiment, for example, the bottom electrode layer 161 may be a TaN layer. According to one embodiment, for example, the bottom electrode layer 161 may have a thickness ranging between 100 and 200 angstroms, for example, about 170 angstroms. Subsequently, the bottom electrode layer 161 may be subjected to a CMP process to reduce the surface roughness of the bottom electrode layer 161.

Figure 9:
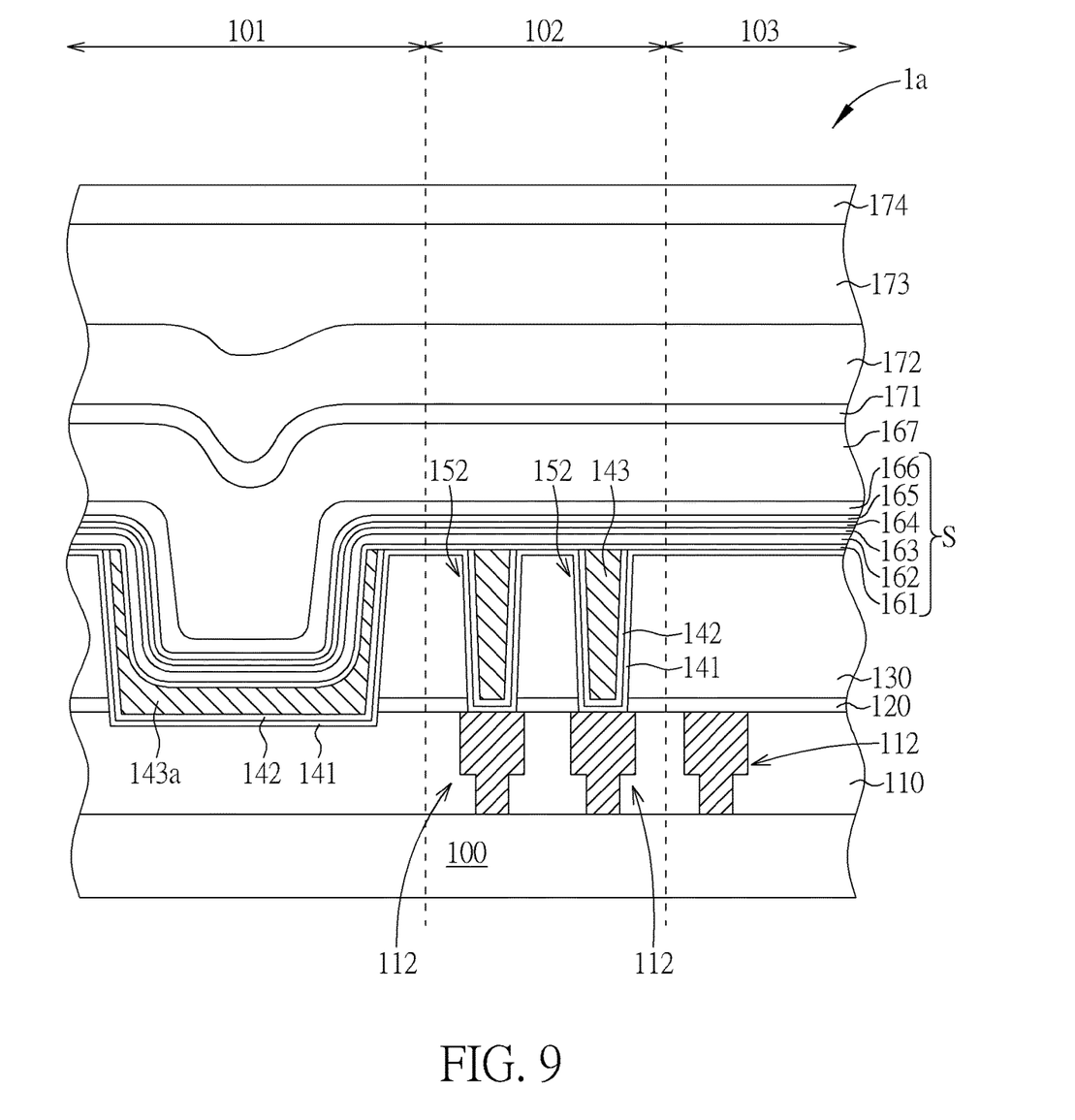

The following process steps are similar with that as depicted through FIG. 5 to FIG. 7. As shown in FIG. 9, after the bottom electrode layer 161 is planarized, an MTJ stack layer S may be deposited on the bottom electrode layer 161. According to one embodiment, for example, the MTJ stack layer S may comprise a seed layer 162 on the bottom electrode layer 161, a magnetic reference layer 163 on the seed layer 162, a tunnel barrier layer 164 on the magnetic reference layer 163, a magnetic free layer 165 on the tunnel barrier layer 164, and a capping layer 166 on the free layer 165. A top electrode layer 167 is then deposited on the MTJ stack layer S. According to one embodiment, for example, the top electrode layer 167 comprises a Ta layer and may have a thickness of about 600 angstroms, but not limited thereto.

According to one embodiment, a silicon nitride hard mask layer 171 is deposited on the top electrode layer 167 and a silicon oxide hard mask layer 172 is deposited on the silicon nitride hard mask layer 171. According to one embodiment, for example, the silicon nitride hard mask layer 171 may have a thickness of about 300 angstroms and the silicon oxide hard mask layer 172 may have a thickness of about 1400 angstroms, but not limited thereto. According to one embodiment, ODL 173 and BARC 174 may be deposited on the silicon oxide hard mask layer 172.

Figure 10:
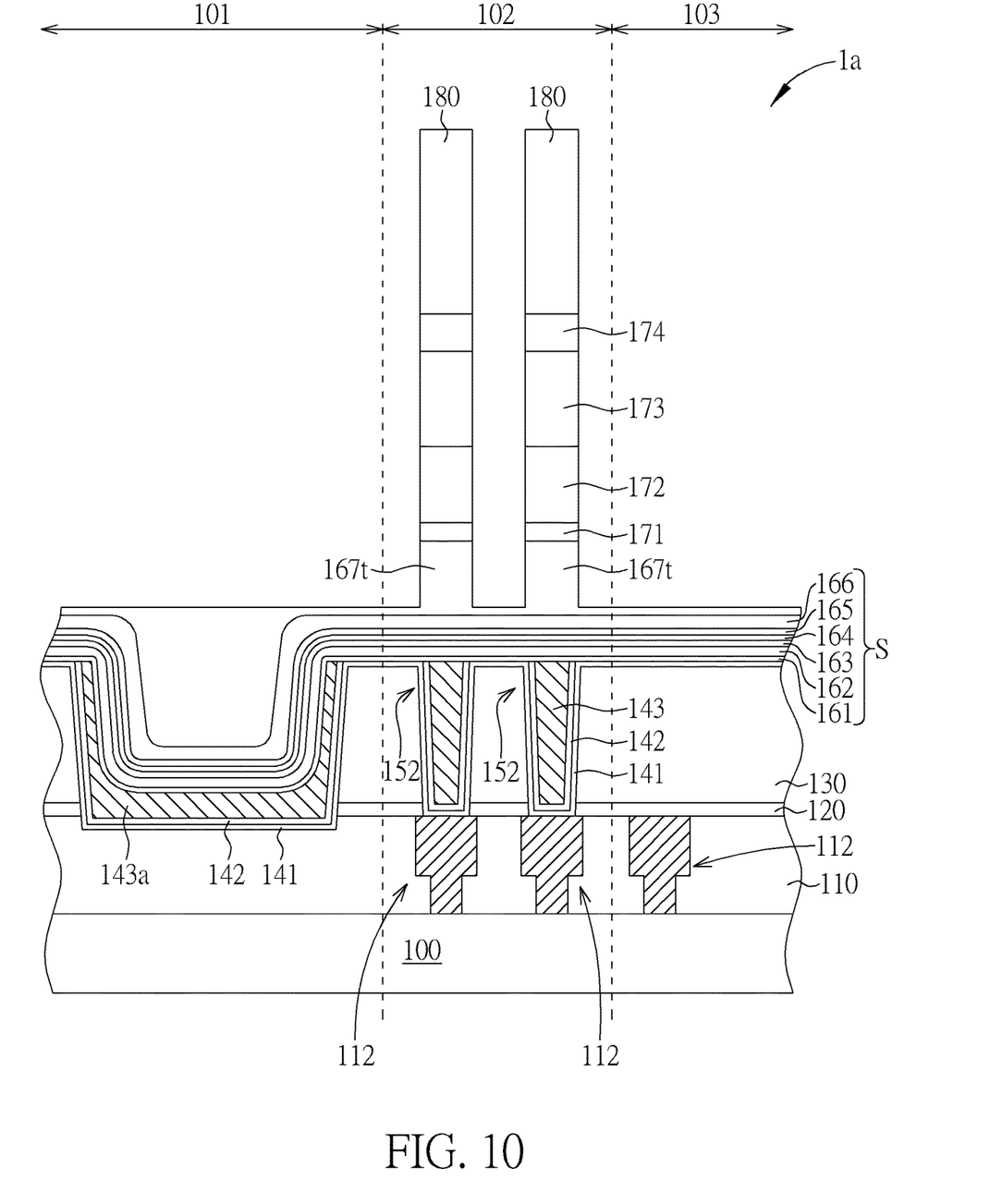

As shown in FIG. 10, a lithographic process and an etching process are carried out to pattern the top electrode layer 167 into top electrodes 167t. For example, a photoresist pattern 180 is formed on the BARC 174. An anisotropic dry etching process may be performed to etch the BARC 174, the ODL 173, the silicon oxide hard mask layer 172, the silicon nitride hard mask layer 171, and the top electrode layer 167 not covered by the photoresist pattern 180. Subsequently, the remaining photoresist pattern 180 may be stripped off.

Figure 11:
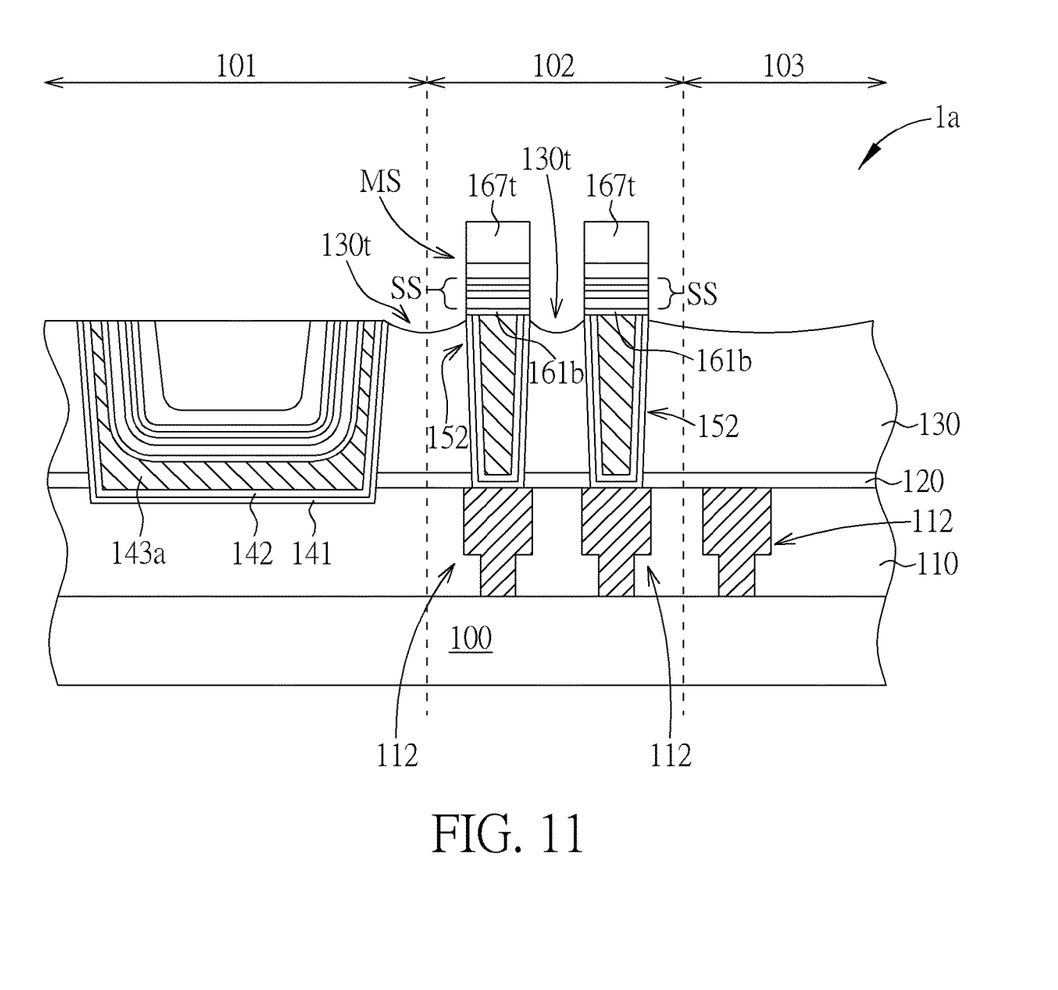

As shown in FIG. 11, an IBE process is then performed to pattern the MTJ stack layer S and the bottom electrode layer 161 into MTJ elements SS and bottom electrodes 161b, thereby forming a magnetic memory element MS on each via plug 152. After the IBE process is performed, a concave or curved top surface 130t of the second dielectric layer 130 is formed around the magnetic memory element MS.

It is advantageous to use the present invention because the introduction of the polish stop layer 141 prior to the deposition of the barrier layer 142, the integrity of the remaining portion 143a of the tungsten layer 143 within the alignment mark trench 101 can be maintained, which increases the process window of the subsequent lithographic processes. The dishing during the tungsten CMP process is overcome and the within die (WID) loading is significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a semiconductor substrate having thereon a first dielectric layer, at least one conductive pattern disposed in the first dielectric layer, and a second dielectric layer covering the first dielectric layer and the at least one conductive pattern;
   forming a via opening in the second dielectric layer, wherein the via opening exposes a portion of the at least one conductive pattern;
   conformally depositing a polish stop layer on the second dielectric layer and within the via opening;
   conformally depositing a barrier layer on the polish stop layer;
   conformally depositing a tungsten layer on the barrier layer;
   polishing the tungsten layer and the barrier layer until the polish stop layer on the second dielectric layer is exposed, thereby forming a via plug in the via opening; and
   conformally depositing a bottom electrode layer on the second dielectric layer and the via plug.

2. The method according to claim 1, wherein the polish stop layer is a tantalum nitride layer and the barrier layer is a titanium nitride layer.

3. The method according to claim 1, wherein the bottom electrode layer is a tantalum nitride layer.

4. The method according to claim 1, wherein a thickness of the polish stop layer is smaller than a thickness of the bottom electrode layer.

5. The method according to claim 4, wherein the thickness of the polish stop layer ranges between 20 and 60 angstroms and the thickness of the bottom electrode layer ranges between 100 and 200 angstroms.

6. The method according to claim 1, wherein after depositing the bottom electrode layer on the second dielectric layer and the via plug, the method further comprises:
   polishing the bottom electrode layer.

7. The method according to claim 6 further comprising:
   depositing a magnetic tunnel junction (MTJ) stack layer on the bottom electrode layer;
   depositing a top electrode layer on the MTJ stack layer; and
   patterning the top electrode layer, the MTJ stack layer and the bottom electrode layer, thereby forming magnetic memory element on the via plug.

8. The method according to claim 7, wherein the top electrode layer comprises a tantalum layer.

9. The method according to claim 7, wherein the MTJ stack layer comprises a reference layer, a tunnel barrier layer, and a free layer.

10. The method according to claim 1 further comprising:
    forming a nitrogen-doped carbide (NDC) layer between the first dielectric layer and the second dielectric layer.

11. A method for fabricating a semiconductor device, comprising:
    providing a semiconductor substrate having thereon a first dielectric layer, at least one conductive pattern disposed in the first dielectric layer, and a second dielectric layer covering the first dielectric layer and the at least one conductive pattern;
    forming a via opening and an alignment mark trench in the second dielectric layer, wherein the via opening exposes a portion of the at least one conductive pattern;
    conformally depositing a polish stop layer on the second dielectric layer and within the via opening and the alignment mark trench;
    conformally depositing a barrier layer on the polish stop layer;
    conformally depositing a tungsten layer on the barrier layer;
    polishing the tungsten layer and the barrier layer until the polish stop layer on the second dielectric layer is exposed, thereby forming a via plug in the via opening, wherein a remaining portion of the tungsten layer within the alignment mark trench constitutes a recessed feature; and
    conformally depositing a bottom electrode layer on the second dielectric layer, the via plug and the recessed feature.

12. The method according to claim 11, wherein the polish stop layer is a tantalum nitride layer and the barrier layer is a titanium nitride layer.

13. The method according to claim 11, wherein the bottom electrode layer is a tantalum nitride layer.

14. The method according to claim 11, wherein a thickness of the polish stop layer is smaller than a thickness of the bottom electrode layer.

15. The method according to claim 14, wherein the thickness of the polish stop layer ranges between 20 and 60 angstroms and the thickness of the bottom electrode layer ranges between 100 and 200 angstroms.

16. The method according to claim 11, wherein after depositing the bottom electrode layer on the second dielectric layer, the via plug and the recessed feature, the method further comprises:
    polishing the bottom electrode layer.

17. The method according to claim 16 further comprising:
    depositing a magnetic tunnel junction (MTJ) stack layer on the bottom electrode layer;
    depositing a top electrode layer on the MTJ stack layer; and
    patterning the top electrode layer, the MTJ stack layer and the bottom electrode layer, thereby forming magnetic memory element on the via plug.

18. The method according to claim 17, wherein the top electrode layer comprises a tantalum layer.

19. The method according to claim 17, wherein the MTJ stack layer comprises a reference layer, a tunnel barrier layer, and a free layer.

20. The method according to claim 11 further comprising:
    forming a nitrogen-doped carbide (NDC) layer between the first dielectric layer and the second dielectric layer.

* * * * *